(12) United States Patent
Do et al.

(10) Patent No.: US 11,107,847 B2
(45) Date of Patent: Aug. 31, 2021

(54) PIXEL AND IMAGING ARRAY WITH REDUCED DARK CURRENT ADAPTED TO LOW LIGHT IMAGING

(71) Applicant: BAE Systems Imaging Solutions Inc., San Jose, CA (US)

(72) Inventors: Hung T. Do, San Jose, CA (US); Chenguang Gong, San Jose, CA (US); Stephen W. Mims, San Diego, CA (US); Khai Nguyen, Stockton, CA (US)

(73) Assignee: BAE Systems Imaging Solutions Inc., San Jose, CA (US)

( * ) Notice: Subject to any disclaimer, the term of this patent is extended or adjusted under 35 U.S.C. 154(b) by 199 days.

(21) Appl. No.: 16/389,789

(22) Filed: Apr. 19, 2019

(65) Prior Publication Data

US 2020/0335538 A1    Oct. 22, 2020

(51) Int. Cl.
| | |
|---|---|
| *H04N 5/357* | (2011.01) |
| *H01L 27/146* | (2006.01) |
| *H04N 5/335* | (2011.01) |
| *H04N 1/00* | (2006.01) |
| *H04N 3/14* | (2006.01) |

(52) U.S. Cl.
CPC .. *H01L 27/14603* (2013.01); *H01L 27/14643* (2013.01); *H04N 1/00007* (2013.01); *H04N 3/15* (2013.01); *H04N 5/335* (2013.01); *H04N 5/357* (2013.01)

(58) Field of Classification Search
CPC ...... H04N 5/3745; H04N 5/361; H04N 5/335; H04N 5/15; H01L 27/14603; H01L 27/14643
See application file for complete search history.

(56) References Cited

U.S. PATENT DOCUMENTS

| | | |
|---|---|---|
| 2009/0236644 A1 | 9/2009 | Adkisson et al. |
| 2013/0020466 A1 | 1/2013 | Ayers et al. |
| 2013/0147996 A1* | 6/2013 | Minowa ............... H04N 5/3597 348/301 |
| 2016/0112662 A1 | 4/2016 | Guillon et al. |
| 2017/0187972 A1* | 6/2017 | Murao ............... H04N 5/37457 |
| 2018/0007306 A1* | 1/2018 | Yanagita ........... H01L 27/14603 |
| 2019/0157328 A1 | 5/2019 | Kitamura et al. |

OTHER PUBLICATIONS

International Search Report, PCT/US20/28457, dated Jul. 21, 2020, 8 pages.
Wang, et al, A 4M, 1.4e-noise, 96dB dynamic range, back-side illuminated CMOS image sensor, Gpixel Inc., ChangChun, China.

* cited by examiner

*Primary Examiner* — Thanh Luu
(74) *Attorney, Agent, or Firm* — Calvin B. Ward

(57) ABSTRACT

A pixel sensor, an imaging array that includes such pixel sensors, and a method for operating an imaging array are disclosed. The pixel sensor includes a transfer gate that connects a photodiode to a floating diffusion node in response to a transfer signal, a reset circuit, and a controller. The reset circuit is adapted to apply either a first potential or a second potential to the floating diffusion node, the second potential being less than the first potential. The controller is configured to cause the reset circuit to apply the first potential to the floating diffusion node while the transfer gate is conducting just prior to a start of an accumulation phase, and then apply the second potential to the floating diffusion node after the transfer gate is rendered non-conducting, the second potential is less than the first potential.

8 Claims, 5 Drawing Sheets

PIXEL AND IMAGING ARRAY WITH REDUCED DARK CURRENT ADAPTED TO LOW LIGHT IMAGING

BACKGROUND

In very low light photography, dark current poses substantial challenges. Low light situations typically require photon counting. To reduce noise, the CMOS imaging sensors typically operate at low temperatures and at very low frame rates, for example five frames per second. The dark currents in the imaging sensor can result in a background charge that is a substantial fraction of the charge accumulated during exposure. Accordingly, there is a need to reduce the dark current during such long exposures.

SUMMARY

A pixel sensor, an imaging array that includes such pixel sensors, and a method for operating an imaging array are disclosed. The pixel sensor includes a transfer gate that connects a photodiode to a floating diffusion node in response to a transfer signal, a reset circuit, and a controller. The reset circuit is adapted to apply either a first potential or a second potential to the floating diffusion node, the second potential being less than the first potential. The controller is configured to cause the reset circuit to apply the first potential to the floating diffusion node while the transfer gate is conducting just prior to a start of an accumulation phase, and then apply the second potential to the floating diffusion node after the transfer gate is rendered non-conducting, the second potential is less than the first potential.

In one aspect, the accumulation phase is characterized by a beginning and wherein the second potential is applied to the floating diffusion node at the beginning of the accumulation phase.

In one aspect, the second potential is applied to the floating diffusion node within a time of 20 percent of the time of the accumulation phase from the beginning of the accumulation phase.

In one aspect, the reset circuit includes a reset gate connecting the floating diffusion node to a reset conductor and a switching circuit that applies either the first potential or the second potential to the reset conductor.

The imaging array includes a plurality of rows and columns of pixel sensors, each row of pixel sensors includes a row reset line that is shared by each pixel sensor in that row of pixel sensors, and each column of pixel sensors includes a bit line that is shared by each pixel sensor in that column. The imaging array also includes a plurality of row reset voltage circuits, each row reset voltage circuit being connected to a corresponding one of the row reset lines, the row reset voltage circuit applying either a first potential or a second potential to that row reset line. A controller controls the row reset voltages. At least one of the pixel sensors includes a transfer gate that connects a photodiode to a floating diffusion node in response to a transfer signal, a reset circuit adapted to apply either a first potential or a second potential to the floating diffusion node, the second potential is less than the first potential; and a reset gate that connects the reset line to the floating diffusion node. The controller is configured to cause the reset circuit to apply the first potential to the floating diffusion node while the transfer gate is conducting just prior to a start of an accumulation phase and then apply the second potential to the floating diffusion node after the transfer gate is rendered non-conducting, the second potential is less than the first potential.

In one aspect, the accumulation phase is characterized by a beginning and wherein the second potential is applied to the floating diffusion node at the beginning of the accumulation phase.

In one aspect, the second potential is applied to the floating diffusion node within a time of 20 percent of the time of the accumulation phase from the beginning of the accumulation phase.

The method for operating an imaging array applies to an imaging array that includes a plurality of pixel sensors, at least of one of the pixel sensors including a transfer gate connecting a photodiode to a floating diffusion node in response to a transfer signal. The method includes applying a first potential to the floating diffusion node prior to a start of an accumulation phase by the transfer gate and then applying the second potential to the floating diffusion node after the transfer gate is rendered non-conducting, the second potential is less than the first potential.

In one aspect, the accumulation phase is characterized by a beginning and wherein the second potential is applied to the floating diffusion node at the beginning of the accumulation phase.

DETAILED DESCRIPTION

Figure 1:
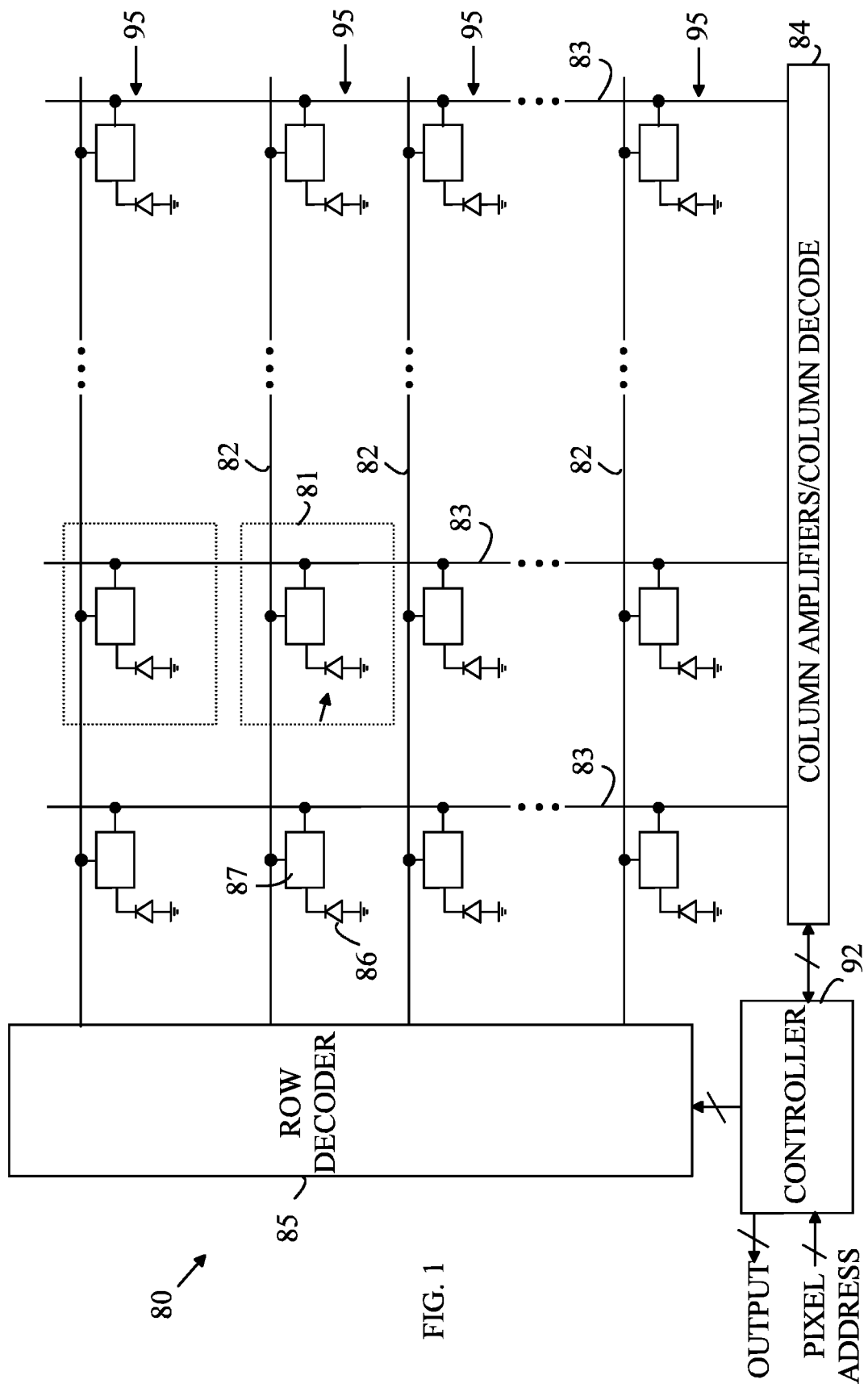
FIG. 1 illustrates a two-dimensional imaging array according to one embodiment.

The manner in which the improved pixel sensors of this disclosure provide their advantages can be more easily understood with reference to a CMOS imaging array. FIG. 1 illustrates a two-dimensional imaging array according to one embodiment. Rectangular imaging array 80 includes a plurality of pixel sensors of which pixel sensor 81 is exemplary. Each pixel sensor has a photodiode 86. The manner in which the pixel sensor operates will be discussed in more detail below. The reset circuitry and amplification circuitry in each pixel is shown at 87. The pixel sensors are arranged as a plurality of rows and columns. Exemplary rows are shown at 95. Each pixel sensor in a column is connected to a readout line 83 that is shared by all of the pixel sensors in that column. Each pixel sensor in a row is connected to a row select line 82 which determines if the pixel sensor in that row is connected to the corresponding readout line.

The operation of rectangular imaging array 80 is controlled by a controller 92 that receives a pixel address to be read out. Controller 92 generates a row select address that is used by row decoder 85 to enable the read out of the pixel sensors on a corresponding row in rectangular imaging array 80. The column amplifiers are included in an array of column amplifiers 84 which execute the readout algorithm, which will be discussed in more detail below. All of the pixel sensors in a given row are read out in parallel; hence there is one column amplification and analog-to-digital converter (ADC) circuit per readout line 83. The column processing circuitry will be discussed in more detail below.

When rectangular imaging array 80 is reset and then exposed to light during an imaging exposure, each photodiode accumulates a charge that depends on the light exposure and the light conversion efficiency of that photodiode. That charge is converted to a voltage by reset and amplification circuitry 87 in that pixel sensor when the row in which the pixel sensor associated with that photodiode is read out. That voltage is coupled to the corresponding readout line 83 and processed by the amplification and ADC circuitry associated with the readout line in question to generate a digital value that represents the amount of light that was incident on the pixel sensor during the imaging exposure.

Figure 2:
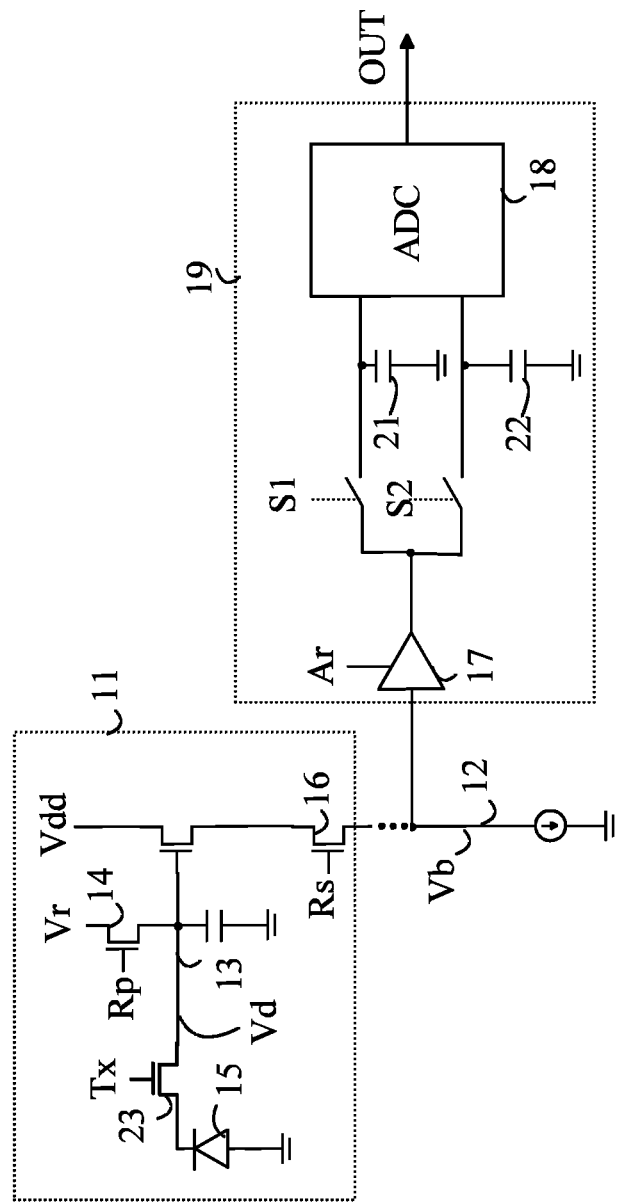
FIG. 2 is a schematic drawing of a pixel sensor in a column of pixel sensors and the associated column readout circuitry.
Figure 3:
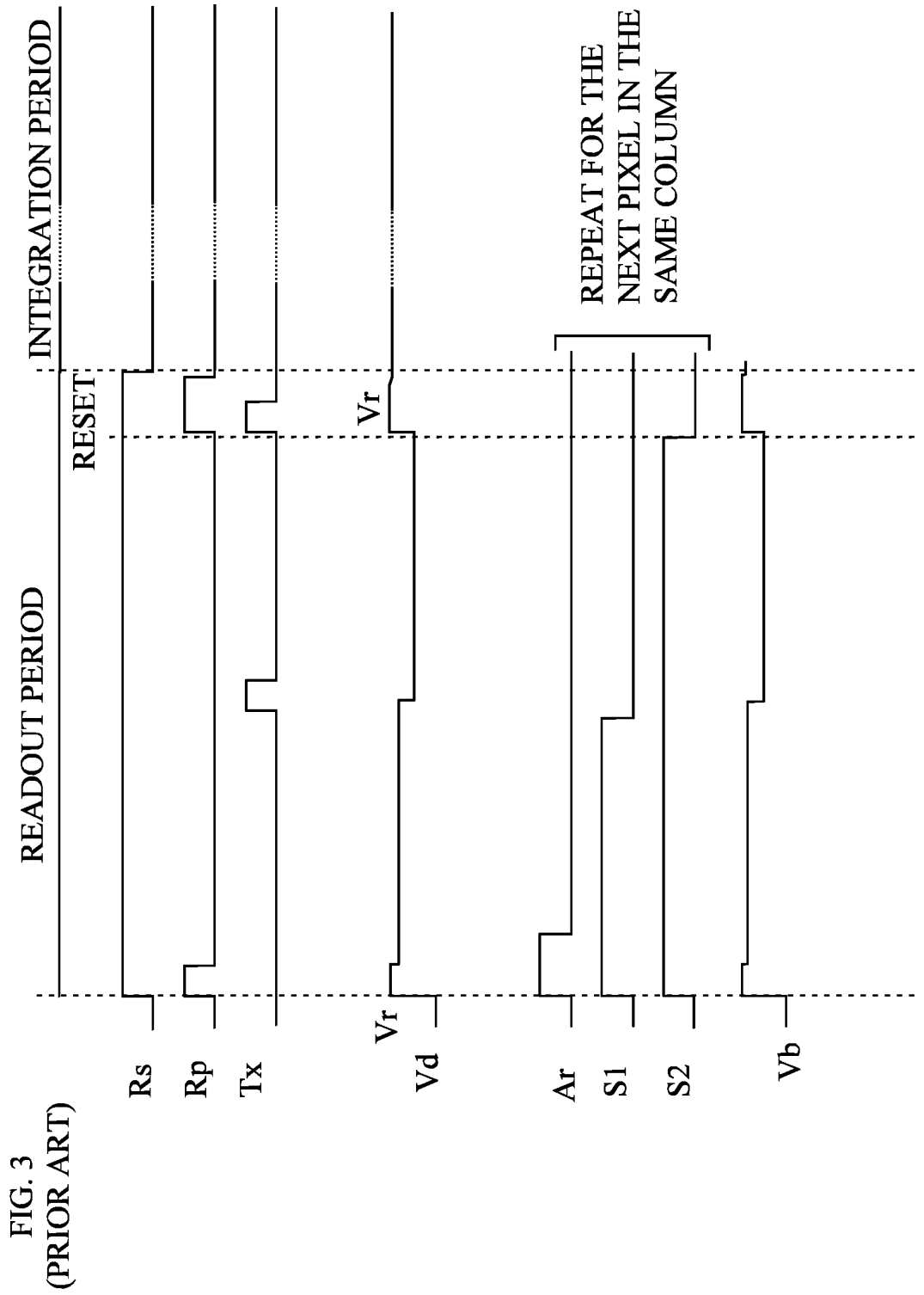
FIG. 3 is a timing diagram for the various control lines in FIG. 2.

Refer now to FIGS. 2 and 3, which illustrate a typical prior art sensor in a column of pixel sensors. FIG. 2 is a schematic drawing of a pixel sensor in a column of pixel sensors and the associated column readout circuitry. FIG. 3 is a timing diagram for the various control lines in FIG. 2. Referring to FIG. 2, pixel sensor 11 is an exemplary pixel sensor in a column of pixel sensors that are connected to bit line 12. The specific pixel sensor in the column that is currently connected to bit line 12 is determined by a row select signal Rs that controls gate 16.

The voltage on bit line 12, Vb, is readout via column readout circuit 19 which is configured for correlated double sampling. During the readout cycle for the row in which pixel sensor 11 is contained, the voltage on floating diffusion node 13, Vd, is measured after floating diffusion node 13 is reset to Vr and after the charge on photodiode 15 that accumulated during the exposure is transferred to floating diffusion node 13 via gate 23. The difference of these voltages is digitized by ADC 18 and is indicative of the charge that was accumulated during the exposure. After the charge accumulated in pixel sensor 11 is read out, floating diffusion node 13 is reset to Vr while gate 23 is in the conducting state. Gate 23 is then rendered non-conducting and a new exposure is commenced.

When the imaging array is operated in a rolling shutter mode, each row of pixel sensors is read out and a new exposure started for that row at the end of the readout. The controller then moves on to the next row and reads out that row and begins the new exposure on that row.

In prior art pixel sensors, floating diffusion node 13 is left at a high voltage during the exposure period. The dark current experienced by photodiode 15 depends on the voltage on floating diffusion node 13 during the exposure period. In low light imaging, the integrated dark current can be a significant fraction of the total charge accumulated by the photodiode during the exposure period.

In a pixel sensor according to one embodiment of the present disclosure, the voltage on floating diffusion node 13 is reduced during the exposure period, and thus, the background from the dark current is substantially reduced.

Figure 4:
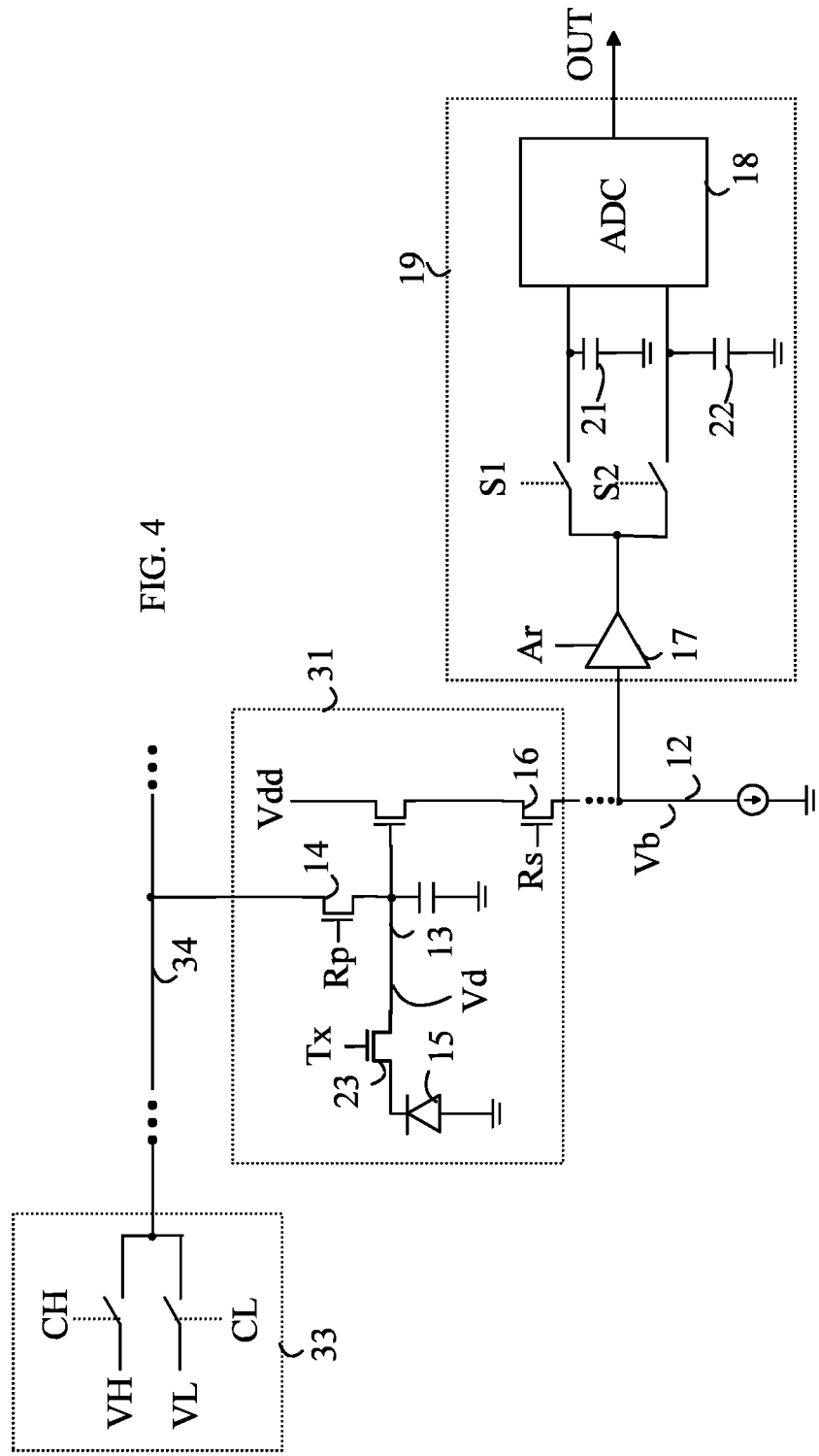
FIG. 4 illustrates the pixel sensors in one column of an imaging sensor that utilizes the reduced voltage on the floating diffusion node during the integration time period.

Refer now to FIG. 4, which illustrates the pixel sensors in one column of an imaging sensor that utilizes the reduced voltage on the floating diffusion node during the integration time period. To simplify the following discussion, the elements in FIG. 4 that serve the same purpose as analogous elements in FIG. 2 have been given the same numeric designations. In the embodiment shown in FIG. 4, the reset voltage is provided to gate 14 via a bus 34 which is connected to a switching circuit 33 in the row decoder 85 shown in FIG. 1. Switching circuit 33 connects the reset gates 14 in the row that is selected to either a high reset voltage, VH, or a low voltage, VL, depending of the state of the control lines CH and CL.

Figure 5:
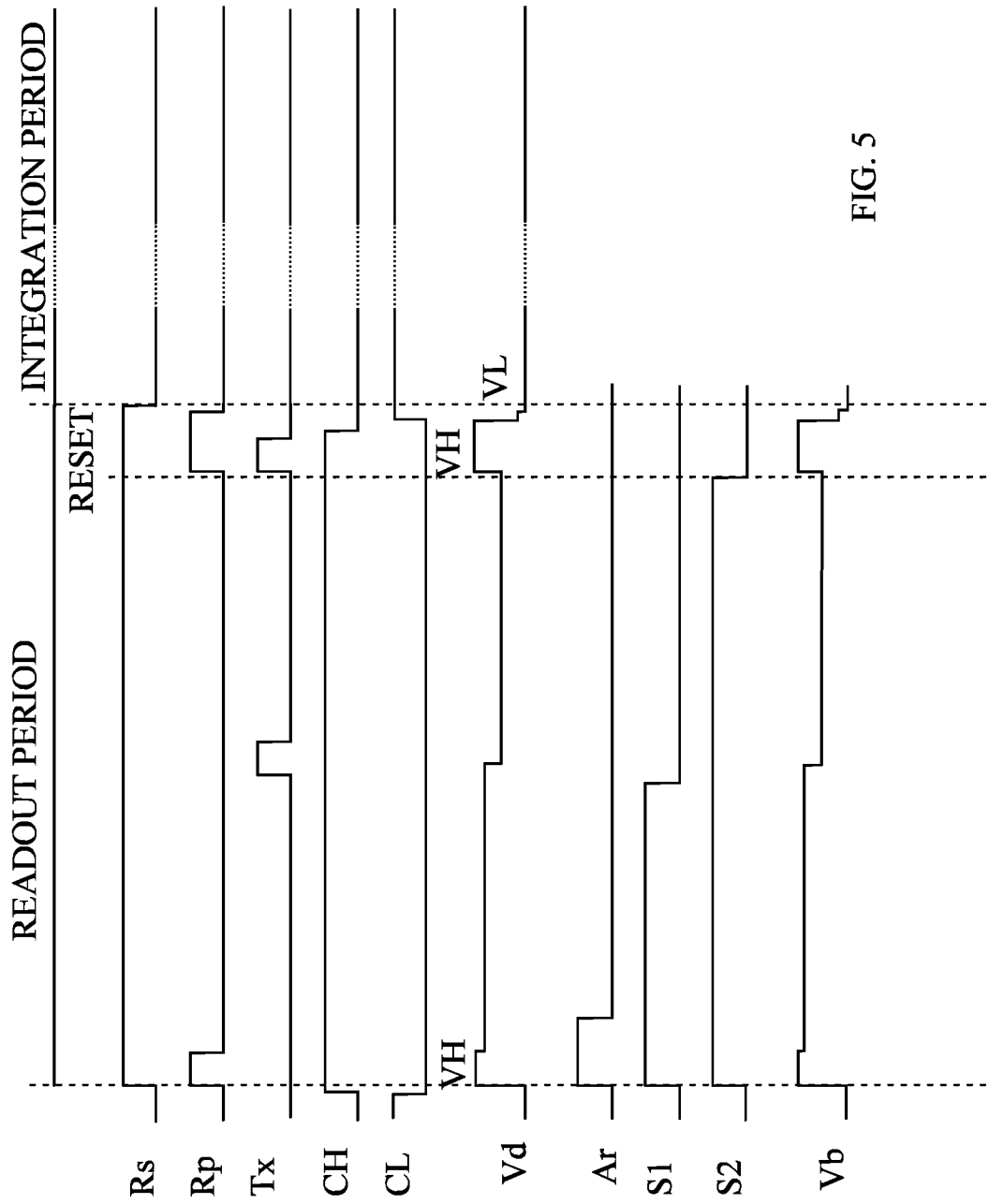
FIG. 5 illustrates the signal timings for the various control signals during the readout and integration period for pixel 31 shown in FIG. 4.

Refer now to FIG. 5, which illustrates the signal timings for the various control signals during the readout and integration period for pixel 31 shown in FIG. 4. At the end of the previous integration period, pixel 31 is selected by asserting the row select signal Rs. At this point, the reset voltage on reset gate 14 is set to VH by closing switch CH and opening switch CL. Floating diffusion node 13 is then reset to VH, and amplifier 17 is reset. The reset voltage on floating diffusion node 13 is then stored on capacitor 21. Gate 23 is then placed in the conducting state, which allows the charge stored on photodiode 15 to move to floating diffusion node 13 and lower the potential on floating diffusion node 13. The new voltage on floating diffusion node 13 is then stored on capacitor 22. At the end of the readout phase, the voltage on floating diffusion node 13 and photodiode 15 is reset to VH, and photodiode 15 is isolated from floating diffusion node 13 by placing gate 23 in the non-conducting state. After photodiode 15 is isolated, the voltage on floating diffusion node 13 is lowered to VL by closing switch CL and opening switch CH while gate 14 is in the conducting state. At this point, the integration phase starts and the readout of pixel 31 is complete.

The controller then repeats the process for the next row of pixels, and so on. When the controller finally returns to the row containing pixel 31, a new readout cycle commences.

The optimum values for VH and VL depend on the particular semiconductor fabrication process used to manufacture the imaging array. VH is preferably as high as possible consistent with the design rules so as to maximize the photocharge that can be stored on the photodiode during the integration period. VL is preferably chosen to be as low as possible. In one exemplary embodiment, VH is 2.5 V and VL is in the range of 0 to 1.0 volt.

The above-described embodiments utilize a particular pixel sensor design. However, the technique disclosed here for reducing the dark current can be applied to other pixel sensor designs having a photodiode separated from a floating diffusion node by a transfer gate. The above described embodiments include a source follower as the amplifier for generating the voltage on the bit line representative of the voltage on the floating diffusion node; however, other forms of buffer amplifier could be utilized without departing from the teachings of the present disclosure.

The above-described embodiments utilize an imaging array organized as a plurality of rows and columns of pixel sensors. However, embodiments in which the imaging array has other configurations can also be constructed. For example, an imaging array having a single column of pixel sensors or even a single pixel sensor can be constructed using the described technique.

In the above described embodiments, the voltage on the floating diffusion node is lowered at the beginning of the accumulation phase of the exposure. For the purposes of the present application, the accumulation phase is defined to begin when the photodiode is disconnected from the floating diffusion node after being reset and end when the photodiode is again connected to the floating diffusion node. For the purposes of the present application, the beginning of the accumulation phase will be defined to be any time that within 10 percent of the length of the accumulation phase from the time the photodiode is isolated from the floating diffusion node.

The advantage provided to an imaging system increases with the length of time that the voltage on the floating diffusion node is reduced. Hence, the voltage is preferably lowered at the beginning of the accumulation phase; however, significant improvements are provided if the voltage is lowered at other points in the accumulation phase. For example, the voltage on the floating diffusion node could be lowered at a point that is within 20 percent of the time of the accumulation phase from the beginning of the accumulation phase.

It should be noted that the "cost" of implementing pixels described in the present disclosure in terms of increased area of silicon is relatively small. At most, two additional gates per row of pixels are required.

The above-described embodiments have been provided to illustrate various aspects of the pixel sensors and imaging arrays. However, it is to be understood that different aspects of that are shown in different specific embodiments can be combined to provide other embodiments. In addition, various modifications will become apparent from the foregoing description and accompanying drawings. Accordingly, pixel sensors and imaging arrays according to the present disclosure are to be limited solely by the scope of the following claims.

What is claimed is:

1. An apparatus comprising a pixel sensor comprising:
   a photodiode;
   a floating diffusion node;
   a transfer gate connecting said photodiode to said floating diffusion node in response to a transfer signal;
   a reset circuit adapted to apply either a first potential or a second potential to said floating diffusion node, said second potential being less than said first potential; and
   a controller configured to cause said reset circuit to apply said first potential to said floating diffusion node while said transfer gate is conducting prior to a start of an accumulation phase, said accumulation phase being characterized by an end of said accumulation phase, and then to apply said second potential to said floating diffusion node after said transfer gate is rendered non-conducting, said floating diffusion node being maintained at a potential less than or equal to said second potential until said end of said accumulation phase wherein said reset circuit comprises a reset gate connecting said floating diffusion node to a reset conductor and a switching circuit that applies either said first potential or said second potential to said reset conductor.

2. The apparatus of claim 1 wherein said second potential is applied to said floating diffusion node at said start of said accumulation phase.

3. The apparatus of claim 1 wherein said accumulation phase is characterized by a duration equal to a difference in time between said start and said end of said accumulation phase and wherein said second potential is applied to said floating diffusion node at a time between said beginning of said accumulation phase and 20 percent of said duration.

4. An imaging array comprising a plurality of rows and columns of pixel sensors, each row of pixels sensors comprises a row reset line, and each column of pixel sensors comprising a bit line that is shared by each pixel sensor in that column;
   a plurality of row reset voltage circuits, each row reset voltage circuit being connected to a corresponding one of said row reset lines, said row reset voltage circuit applying either a first potential or a second potential to said row reset line;
   a controller that controls said row reset voltage circuits, wherein at least one of said pixel sensors comprises:
   a photodiode;
   a floating diffusion node;
   a transfer gate connecting said photodiode to said floating diffusion node in response to a transfer signal;
   a reset circuit adapted to apply either said first potential or said second potential to said floating diffusion node, said second potential being less than said first potential; and
   a reset gate connecting said reset line to said floating diffusion node,
and wherein
   said controller is configured to cause said reset circuit to apply said first potential to said floating diffusion node while said transfer gate is conducting prior to a start of an accumulation phase, said accumulation phase being characterized by an end of said accumulation phase, and then to apply said second potential to said floating diffusion node after said transfer gate is rendered non-conducting, said floating diffusion node being maintained at a potential less than or equal to said second potential until said end of said accumulation phase, and said reset circuit comprises a reset gate connecting said floating diffusion node to a reset conductor and a switching circuit that applies either said first potential or said second potential to said reset conductor.

5. The imaging array of claim 4 wherein said second potential is applied to said floating diffusion node at said start of said accumulation phase.

6. The imaging array of claim 4 wherein said accumulation phase is characterized by a duration equal to a difference in time between said start and said end of said accumulation phase, and wherein said second potential is applied to said floating diffusion node at a time between said start of said accumulation phase and 20 percent of said duration.

7. A method for operating an imaging array comprising a plurality of pixel sensors, at least of one of said pixel sensors comprising:
   a photodiode;
   a floating diffusion node;
   a reset gate connecting said floating diffusion node to a reset conductor and a switching circuit that applies either a first potential or a second potential to said reset conductor, said first potential being greater than said second potential; and
   a transfer gate connecting said photodiode to said floating diffusion node in response to a transfer signal, said method comprising:
   applying said first potential to said floating diffusion node prior to a start of an accumulation phase, said accumulation phase being characterized by an end of said accumulation phase, by placing said reset gate in a conducting state and causing said switching circuit to apply said first potential to said reset conductor and then applying said second potential to said floating diffusion node after said start of said accumulation phase by placing said reset gate in a conducting state and causing said switching circuit to apply said second potential to said reset conductor and maintaining said diffusion node at a potential less than or equal to said second potential until said end of said accumulation phase.

8. The method of claim 7 wherein said second potential is applied to said floating diffusion node at said start of said accumulation phase.

\* \* \* \* \*